(12) United States Patent
Tsang

(10) Patent No.: US 8,427,040 B2
(45) Date of Patent: Apr. 23, 2013

(54) LIGHT EMITTING ELEMENT PACKAGE WITH VARIABLE COLOR TEMPERATURE

(75) Inventor: Jian-Shihn Tsang, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 230 days.

(21) Appl. No.: 13/092,154

(22) Filed: Apr. 22, 2011

(65) Prior Publication Data
US 2012/0098410 A1 Apr. 26, 2012

(51) Int. Cl.
*H01J 1/62* (2006.01)

(52) U.S. Cl.
USPC .................... 313/483; 313/486; 313/487

(58) Field of Classification Search ........... 313/483–489
See application file for complete search history.

(56) References Cited

U.S. PATENT DOCUMENTS
2009/0091920 A1 4/2009 Naijo et al.
2010/0157585 A1 6/2010 Diekmann et al.

FOREIGN PATENT DOCUMENTS
| TW | I231925 | 5/2005 |
| TW | 200739151 A | 10/2007 |
| TW | 200830596 A | 7/2008 |
| TW | 200923272 A | 6/2009 |

*Primary Examiner* — Joseph L Williams
(74) *Attorney, Agent, or Firm* — Altis Law Group, Inc.

(57) ABSTRACT

A light emitting element package includes first and second light emitting elements, a phosphor film consisting of first and second phosphor elements and a sensing module. The sensing module is configured for modulating light intensity of the at least one second light emitting element. Light of a first color temperature is generated when light from the at least one first light emitting element passes through the first phosphor elements. Light of a second color temperature is generated when light of the at least one second light emitting element passes through the second phosphor elements. Light of a predetermined color temperature is generated by mixing the light of the first color temperature and the light of the second color temperature.

16 Claims, 2 Drawing Sheets

LIGHT EMITTING ELEMENT PACKAGE WITH VARIABLE COLOR TEMPERATURE

BACKGROUND

1. Technical Field

The disclosure relates generally to illumination technology, and more particularly to a light emitting element package with multiple phosphor elements whereby a color temperature of the light emitting package is variable.

2. Description of the Related Art

Normally, color temperature of a light emitting element is fixed and not variable. Therefore, there is a need for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout two views.

DETAILED DESCRIPTION

The disclosure is illustrated by way of example and not by way of limitation in the figures of the accompanying drawings. It should be noted that references to "an" or "one" embodiment in this disclosure are not necessarily to the same embodiment, and such references mean at least one.

Figure 1:
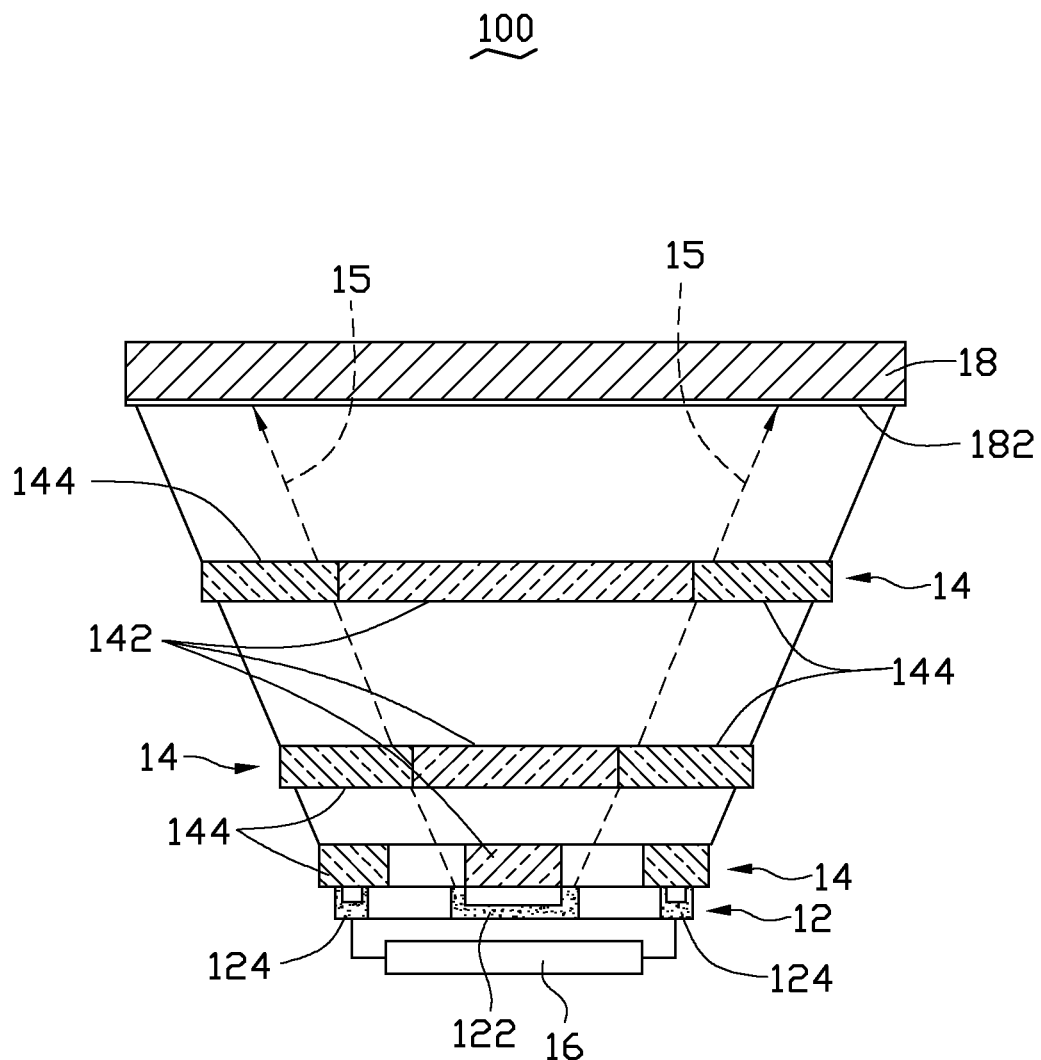
FIG. 1 is a cross-section of a light emitting element package in accordance with a first embodiment of the disclosure.

Referring to FIG. 1, a light emitting element package 100 in accordance with a first embodiment of the disclosure includes a light source module 12, a phosphor film 14, and a sensing module 16.

The light source module 12 includes at least one first light emitting element 122 and at least one second light emitting element 124.

The phosphor film 14 is mounted on the light source module 12. The phosphor film 14 includes first phosphor elements 142 and second phosphor elements 144, located respectively corresponding to the at least one first light emitting element 122 and the at least one second light emitting element 124. The first phosphor elements 142 and the second phosphor elements 144 comprise sulfides, aluminates, oxides, silicates, or nitrides. The first phosphor elements 142 and the second phosphor elements 144 are green phosphor elements, red phosphor elements, blue phosphor elements or a combination thereof. The green phosphor elements include sulfide phosphor elements, silicate phosphor elements, nitride phosphor elements, oxynitride phosphor elements, Garnet phosphor elements or SiAlNO phosphor elements.

The at least one first light emitting element 122 is located substantially in the center of the light source 12. The at least one second light emitting element 124 is located on the exterior of the light source module 12.

In the first embodiment, the at least one first light emitting element 122 is configured for emitting UV light or blue light. The first phosphor elements 142 are green phosphor elements. Light distribution area of the at least one first light emitting element 122 as indicated by broken lines with arrow heads 15 exceeds or equals that of each of the first phosphor elements 142. When light from the at least one first light emitting element 122 passes through the first phosphor elements 142, light of a first color temperature is generated.

The at least one first light emitting element 122 is configured for emitting UV light or blue light. The second phosphor elements 144 are red phosphor elements.

Light intensity of the at least one second light emitting element 124 can be adjusted by the sensing module 16 which can alter the operating current applied to the at least one second light emitting element 124. When light from the at least one second light emitting element 124 passes through the second phosphor elements 144, light of a second color temperature is generated. Thus, light of a predetermined color temperature can be generated by mixing the light of the first color temperature and the light of the second color temperature.

The light emitting element package 100 further includes an optical film 18 at a light emitting surface of the light emitting element package 12. The optical film 18 is also configured for efficiently mixing the light of the first color temperature and the light of the second color temperature.

The optical film 18 is a UV light filter. The optical film 18 includes a plurality of diffusion particles to increase the light diffusion effectiveness. The color temperature of the light generated by the light emitting element package 100 is variable by the sensing module 16.

Figure 2:
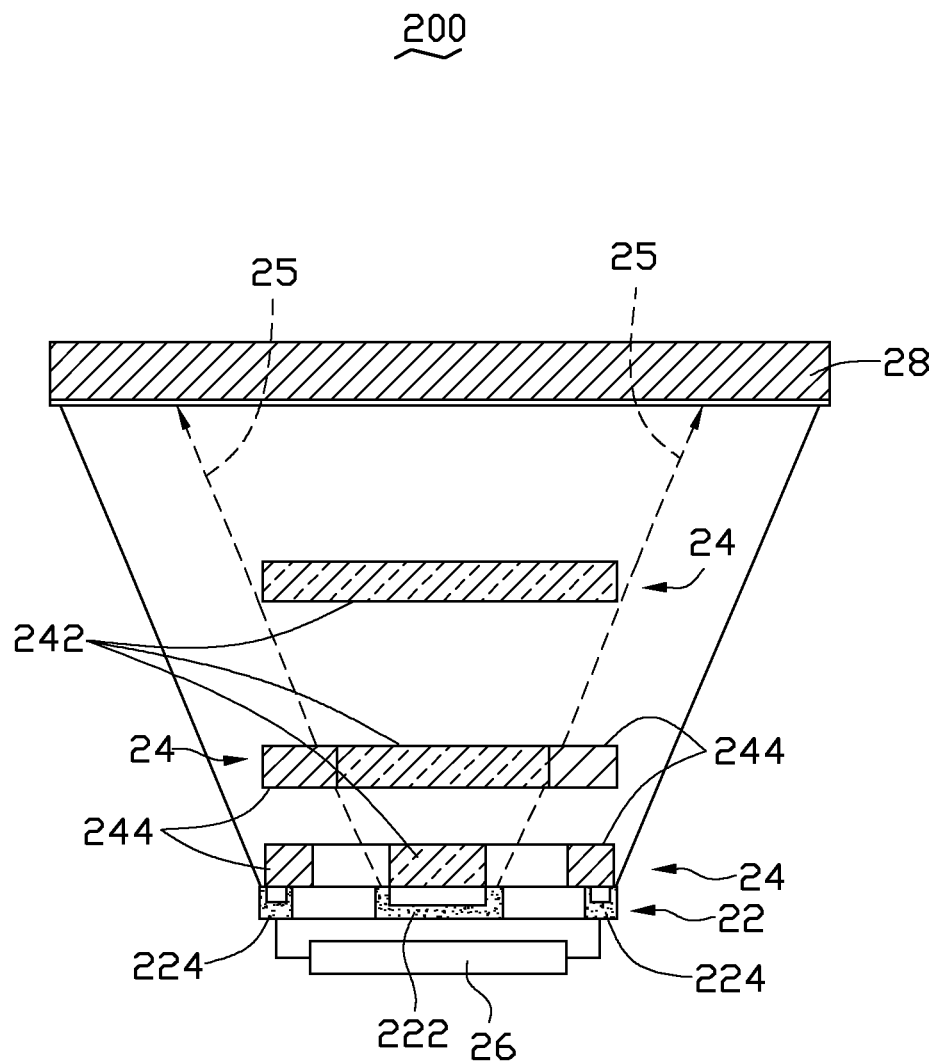
FIG. 2 is a cross-section of a light emitting element package in accordance with a second embodiment of the disclosure.

Referring to FIG. 2, a light emitting element package 200 in accordance with a second embodiment of the disclosure differs from the light emitting element package 100 of the first embodiment only in that the phosphor film 24 includes only third phosphor elements 242 mounted over the at least one first light emitting element 224.

The third phosphor elements 242 are green phosphor elements. The third phosphor elements 242 are located corresponding to the at least one first light emitting element 222 of the light source module 22. When light from the at least one first light emitting element 222 passes through the third phosphor elements 242, light of a third color temperature is generated.

A diffusion film 244 defined at the exterior part of the phosphor film 24 is configured for increasing diffusion effectiveness of light from at least second light emitting element 224. The at least one second light emitting element 224 is configured for emitting blue light or red light.

When light from the at least one second light emitting element 224 passes through the diffusion film 244, light of a fourth color temperature is generated. Thus, light with a predetermined color temperature can be generated by mixing the light of the third color temperature and the light of the fourth color temperature. Light intensity of the at least one second light emitting element 224 can be adjusted by the sensing module 26 which can alter the operating current applied to the at least one second light emitting element 224. Thus, the color temperature of the light generated by the light emitting element package 200 is variable by the sensing module 26. A diffusion plate 28 is provided at a top of the light emitting element package 200 for increasing light diffusion effectiveness of the light generated by the light emitting element package 200.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting element package comprising:
   a light source module comprising at least one first light emitting element and at least one second light emitting element;
   a phosphor film comprising a plurality first phosphor elements located over the at least one first light emitting element; and
   a sensing module configured for modulating light intensity of the at least one second light emitting element, light of a first color temperature generated when light from the at least one first light emitting element passes through the first phosphor elements of the phosphor film, light of a second color temperature being generated by the at least one second light emitting element, light with a predetermined color temperature generated by mixing the light of the first color temperature and the light of the second color temperature.

2. The light emitting element package of claim 1, wherein the phosphor film further comprises a plurality of second phosphor elements, the light of a second color temperature being generated by the light from the at least one second light emitting element passing through the second phosphor elements.

3. The light emitting element package of claim 1, wherein the phosphor film further comprises a plurality of the second phosphor elements mounted over the at least one second light emitting element, the light of a second color temperature being generated by the light from the at least one second light emitting element passing through the second phosphor elements.

4. The light emitting element package of claim 1, wherein the at least one first light emitting element is located substantially in the center of the light source module, the at least one second light emitting element is located on the exterior of the light source module.

5. The light emitting element package of claim 1, wherein the at least one first light emitting element and the at least one second light emitting element are configured for emitting UV light or blue light.

6. The light emitting element package of claim 4, wherein an area of a light distribution of the light of the at least one first light emitting element exceeds an area of each of the first phosphor elements of the phosphor film.

7. The light emitting element package of claim 2, wherein the first phosphor elements and the second phosphor elements comprise sulfides, aluminates, oxides, silicates, or nitrides.

8. The light emitting element package of claim 3, wherein the first phosphor elements and the second phosphor elements comprise sulfides, aluminates, oxides, silicates, or nitrides.

9. The light emitting element package of claim 1, wherein the first phosphor elements are green phosphor elements, red phosphor elements, blue phosphor elements or a combination thereof.

10. The light emitting element package of claim 1, further comprising a diffusion film located over the at least one second light emitting element, and the light of a second color temperature being generated by the light from the at least one second light emitting element passing through the diffusion film.

11. The light emitting element package of claim 10, wherein the at least one second light emitting element is configured for emitting blue light or red light.

12. The light emitting element package of claim 1, further comprising an optical film located at light emitting surface thereof.

13. The light emitting element package of claim 12, wherein the optical film is a filter.

14. The light emitting element package of claim 12, wherein the optical film further comprises a plurality of diffusion particles.

15. The light emitting element package of claim 1, wherein the first phosphor elements are green phosphor elements.

16. The light emitting element package of claim 15, wherein each of the green phosphor elements is selected from the group consisting of silicate phosphor element, nitride phosphor element, oxynitride phosphor element, Garnet phosphor element and SiAlON phosphor element.

* * * * *

UNITED STATES PATENT AND TRADEMARK OFFICE
CERTIFICATE OF CORRECTION

PATENT NO. : 8,427,040 B2  
APPLICATION NO. : 13/092154  
DATED : April 23, 2013  
INVENTOR(S) : Jian-Shihn Tsang Page 1 of 1

It is certified that error appears in the above-identified patent and that said Letters Patent is hereby corrected as shown below:

Title Page, below Item (22) insert

-- (30)    Foreign Application Priority Data  
Oct. 20, 2010   (TW) ......................99135849 --.

Signed and Sealed this  
Twenty-fourth Day of December, 2013

Margaret A. Focarino  
*Commissioner for Patents of the United States Patent and Trademark Office*